United States Patent
Sachs

(10) Patent No.: US 6,910,199 B2
(45) Date of Patent: Jun. 21, 2005

(54) CIRCUIT GROUP DESIGN METHODOLOGIES

(75) Inventor: Howard G. Sachs, Los Altos, CA (US)

(73) Assignee: Telairity Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 09/840,747

(22) Filed: Apr. 23, 2001

(65) Prior Publication Data

US 2002/0184600 A1 Dec. 5, 2002

(51) Int. Cl.$^7$ .............................................. G06F 17/50
(52) U.S. Cl. .................................. 716/8; 716/1; 716/7
(58) Field of Search .................................. 716/8, 7, 1

(56) References Cited

U.S. PATENT DOCUMENTS

| | | | |
|---|---|---|---|
| 4,584,653 A | * 4/1986 | Chih et al. ..................... 716/17 |
| 4,701,860 A | * 10/1987 | Mader .......................... 716/12 |
| 5,031,111 A | 7/1991 | Chao et al. |
| 5,124,776 A | 6/1992 | Tanizawa et al. |
| 5,388,055 A | 2/1995 | Tanizawa et al. |
| 5,490,103 A | 2/1996 | Haraguchi et al. |
| 5,502,644 A | 3/1996 | Hamilton et al. |
| 5,598,344 A | 1/1997 | Dangelo et al. |
| 5,623,417 A | 4/1997 | Iwasaki et al. |
| 5,623,418 A | 4/1997 | Rostoker et al. |
| 5,666,289 A | 9/1997 | Watkins |
| 5,671,397 A | * 9/1997 | Crafts .......................... 716/17 |
| 5,761,078 A | 6/1998 | Fuller et al. |
| 5,801,958 A | 9/1998 | Dangelo et al. |
| 5,847,968 A | 12/1998 | Miura et al. |
| 5,867,399 A | 2/1999 | Rostoker et al. |
| 5,870,308 A | 2/1999 | Dangelo et al. |
| 5,880,971 A | * 3/1999 | Dangelo et al. ............... 716/6 |
| 5,910,897 A | 6/1999 | Dangelo et al. |
| 5,933,356 A | 8/1999 | Rostoker et al. |
| 5,963,454 A | 10/1999 | Dockser et al. |
| 5,984,510 A | * 11/1999 | Guruswamy et al. .......... 716/2 |
| 5,994,946 A | 11/1999 | Zhang |
| 6,011,911 A | 1/2000 | Ho et al. |
| 6,182,272 B1 | * 1/2001 | Andreev et al. ............... 716/13 |
| 6,298,468 B1 | * 10/2001 | Zhen ............................. 716/2 |
| 6,397,375 B1 | * 5/2002 | Block et al. ................. 326/101 |
| 6,467,074 B1 | 10/2002 | Katsioulas et al. |
| 6,477,690 B1 | * 11/2002 | Witte et al. .................... 716/12 |
| 6,532,580 B1 | * 3/2003 | Josephson et al. ............. 716/10 |

OTHER PUBLICATIONS

"DesignWare Foundation Library," Synopsys, Inc., pp. 1–5.
"CBAll Design System Tools," Synopsys, Inc., www.synopsys.com/products/siarc/des_sys_ds.html, pp. 1–7.
"Synopsys and Infineon," Synopsys, Inc., www.synopsys.com/products/designware/designware.html, pp. 1–2.
"Synopsys Adds Silicon Libraries and Additional Macro-cells to DesignWare(R)," Synopsys, Inc., www.synopsys.com/news/announce/press2000/sil_lib_pr.html, pp. 1–4.
"A First Tool of SpecGen™ Series : Designing from System Specification," *VisualSpec*, Y Explorations, Inc. (Irvine, CA), two pages.
S. Posluszny, et al., "'Timing Closure by Design,' A High Frequency Microprocessor Design Methodology," IBM Austin Research Lab (Austin, TX), six pages.

* cited by examiner

*Primary Examiner*—A. M. Thompson
*Assistant Examiner*—Brandon Bowers
(74) *Attorney, Agent, or Firm*—Townsend and Townsend and Crew LLP

(57) ABSTRACT

A group based design methodology and system. In one embodiment the groups have predefined layout characteristics and are sometimes amalgamated into functions. Integrated circuits are designed by placing groups and functions into a layout space.

19 Claims, 9 Drawing Sheets

CIRCUIT GROUP DESIGN METHODOLOGIES

BACKGROUND OF THE INVENTION

The present invention relates generally to very large scale integrated (VLSI) circuits, Systems on a Chip (SOC), and more particularly to group based integrated circuit design methodologies and integrated circuits developed using group based design methodologies.

Advances in integrated circuit technology allow for the production of integrated circuit semiconductor devices having millions of gates, with each of the gates made up of multiple transistors. These semiconductor devices perform an array of tasks, some of which are exceedingly complex.

The complexity of the tasks performed by the devices has resulted in part from advances in the capabilities of design related tools, many of which are concerned with the synthesis of designs from a high level description language to a register transfer level description, and then to low level circuit elements. These tools often reduce the amount of detail a designer must determine to design an integrated circuit. In many instances, the tools determine, based on the input of a designer and predetermined rules, many of the details of the design. The tools therefore, at least theoretically, reduce the effort required to design an integrated circuit.

These design tools therefore assist designers in managing the complexity of integrated circuits. To an extent, design tools abstract the design of the integrated circuits, as well as the processes used to test, verify and implement the circuits. This abstraction reduces the amount of detail required to be specified and understood by designers. This abstraction, accordingly, may allow a design team to implement a device whose complexity may otherwise overwhelm the capabilities of the design team.

For example, in an ideal case the designer merely specifies behavior, using an HDL, such as Verilog, or VHDL or the like. Complex tools translate the specified behavior through numerous stages. This translation, or transformation, often synthesizes a high level description to an RTL model, and then synthesizes the RTL model to a cell or gate level description. The tools also sometimes verifies the correctness of the translations, and also provides a physical layout of transistors or gates, and signal paths interconnecting the transistors or gates, to implement the specified behavior.

Unfortunately, the use of such tools often introduce some inefficiencies and inconsistencies from desired behavior. For example, the tools often partition the design into relatively low level constituent parts. The low level constituent parts are then mapped into relatively low level circuits, often approximating the logic gate level. The partitioning and mapping, as well as the low level constituent parts, are often somewhat generalized, and are not optimized to perform specific tasks. The resulting circuit or system is therefore sometimes inefficient in terms of power, performance or area usage.

In addition, the tools often use a set of heuristics to automatically determine signal routing among the relatively lower level circuits. The use of automatic routing may have several unintended results. For example, automatic signal routing may result in unexpectedly long signal paths, requiring the use of increased power by driver circuits. Also the use of statistical wire load models can introduce incorrect timing information, resulting in timing closure problems.

Thus, while in some cases the use of such design tools may allow for decreased design time, the use of the tools may often result in inefficient physical designs in terms of size, performance, and power. The designs are inefficient because the gate or transistor count is not optimized, and the signal routing is awkward. Accordingly, the use of such design tools would appear to require a trade-off of increased circuit power and size utilization for decreased design time.

Unfortunately, the use of such design tools may also inadvertently result in lengthened design cycles. For example, when using synthesis, signal degradation may occur or out of budget clock skew may result, because of cross-talk (sometimes called signal integrity). It may be difficult to detect this signal interference due to cross-talk, and determining timing problems may be difficult. Moreover, these inefficiencies may be particularly pronounced for devices operating at high clock speeds, which are often more susceptible to timing problems, and devices built with deep submicron technologies, which often are more susceptible to signal cross-talk.

In addition, the use of machine chosen circuit elements and circuit routing makes error resolution difficult in that the circuit layout may not be intuitively understood or understandable by the designer or the person doing the debugging. For example, each synthesis operation transforms the design, and may do so for the complete design in a global fashion. Such a transformation may result in an unoptimized, difficult to comprehend design. In the event of errors such a design is likely to be difficult to debug. Thus, as circuit complexity increases and as the circuit geometry decreases, circuit debugging is difficult to do and timing closure becomes more difficult to obtain.

For many years in the prior art, libraries have been constructed that allow direct implementation of primitive Boolean functions. Typically these libraries consist of AND, OR, NOR, NAND, XOR, flip-flops and the like. The term "cell" is almost universally applied to such approach, a library of cells, called "cell library" is often referred to as the basic building blocks for more complex circuit designs. Sometimes these elements of a cell library implemented multiple Boolean functions in one cell to provide a more complex Boolean expression. An example is AOI (AND/OR/INVERT).

In another approach to providing complex functionality, beginning in about the early 1960's, microcode was widely used to implement computer instructions. Commonly used sequences of instructions were kept together and reused in other programs or decoding schemes. These sequences were called "Macros" or Macrocode. Later, the term Macro began to be used to describe a larger grouping of cells from the cell library, typically 4 or 5 cells combined in a "super cell" or macro. These small number of cells provided a small productivity improvement for the designer.

A further approach to complex circuit design popularized in about the 1980's is the gate array. Gate arrays were used heavily, and it became common for the gate array design service to provide a cell library of Boolean primitives, as well as macros. These macros typically contained on the order of 10 to 20 gates. By the mid-1980's cell libraries became quite complex to support new synthesis tools. Some cell libraries contained 50 to 100 cells. To make synthesis more efficient cell libraries of 500 to 1000 cells have been developed. Each cell usually contains only 1 to 10 gates, but have varying power levels and many combinations of inverting capability.

Today, cell libraries continue to exist, and are used for all Standard Cell, Gate Array and Embedded Array designs.

Macro's are still in use but are primarily for use in conjunction with FPGA's and CPLD's, and are still composed of a small number of gates. The large electronic design automation vendors, often use the terms macros, cores and IP as synonymous. In fact the RMM book from Synopsys and Mentor Graphics define them as being the same as a "Block." Usually a block is defined as a 50,000 to 200,000 gates of logic. In many cases today IP or cores are blocks that describe a function such as a PCI core or a register file or a memory. Thus a core, or IP, tends to be functionally oriented and is usually larger than 50,000 gates. These cores or blocks can be hard or soft, where hard is in physical form and soft is in logical form, typically RTL.

Thus what is needed is a more efficient approach to the design of complex circuits or systems, which allows the designer to combine larger numbers of circuit cells or gates into a significant enough amount of circuitry that enables easier design of complex functionality, but which is also reusable for other designs. At the same time the combination yields higher performance,reduced circuit area, lower power, and improved productivity compared to prior art approaches.

SUMMARY OF THE INVENTION

This invention provides a design tool, and design methodology which uses a new grouping of gates called a "Group." A group contains approximately 1000 gates. It is designed not only for reuse, but for the capability of being a generic logical entity, and generally will be more compact in layout, and higher in performance than cell based designs. This approach implements the idea that there exists a larger generic group of logic gates than the cell library, but which can be used to build all other more complex functions. For example a small embedded processor core (or block) includes 50,000 gates and uses 20,000 cells (where each cell contains 2 or 3 gates on average). The technology described here allows this core to be built with 50 optimized pre-built groups.

In one embodiment, the present invention provides a method of determining a definition of a physical representation of at least a portion of an integrated circuit. The integrated circuit performs logic operations, arithmetic operations, control operations, analog and memory operations. The integrated circuit is comprised of a plurality of groups, each group being largely comprised of between 300 and 3,000 gates. The groups are present in a library of groups, with each group being predefined logically as well as in terms of its physical layout. The physical layouts have predefined boundaries with predefined interconnection points along the physical boundaries. In another embodiment it is possible to have interconnection points inside the boundary. Some of the groups may be amalgamated into functions, with the functions being present in a file of functions. In one embodiment the method comprises selecting an item, with the item being a group or a function, for placement on a layout. The method further comprises placing the item on the layout. In addition, the method also comprises selecting a further item for placement on the layout, and placing the further item on the layout, as well as defining interconnections between the item and the further item. One of the major advantages of this invention is that there is no need to have "glue" logic, that is all of the functions of the design or system can be constructed from groups and no special translation logic is necessary to connect the groups together.

To summarize, cells are basic physical Boolean implementations, blocks or macros or IP or cores are functional implementations, in hard or soft form. The blocks are not generic and usually have to be redesigned for another similar application and certainly redesigned for a different application. The novel group concept described here is a collection of approximately 1000 gates that are independent of most applications and can be used with other groups to form a more complex function.

This invention provides a group-based design methodology. In one embodiment the present invention comprises a process of designing an integrated circuit. The process includes determining a specification for an integrated circuit. Functions are mapped to the specification, with the functions being comprised of groups. The process further comprises, determining the placement of the functions in a layout. In one embodiment the functions are predefined sizes and shapes, and the groups are predefined sizes and shapes. Moreover, in one embodiment the groups have predefined interconnection points, and the groups are comprised of logic gates numbering, in an order of magnitude, about 1,000 gates.

The use and other aspects of the present invention will be more readily appreciated in light of the accompanying detailed description and in view of the accompanying figures.

BRIEF DESCRIPTION OF THE DRAWINGS

FIG. 7 is a block diagram of an integrated circuit design comprised of groups;

DESCRIPTION OF THE SPECIFIC EMBODIMENTS

Figure 1:
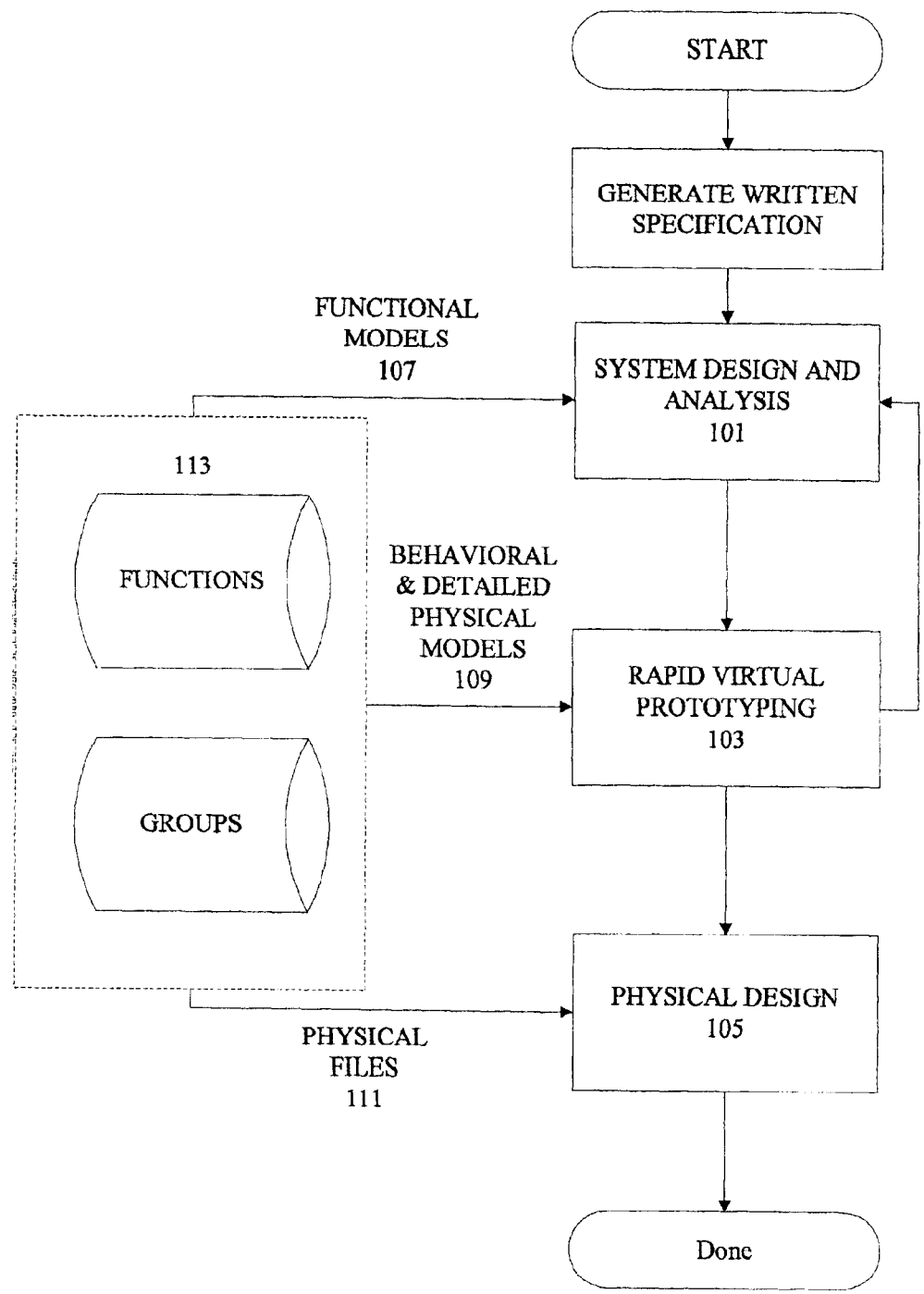
FIG. 1 is a flow chart of a process for designing a system in accordance with aspects of the present invention.

FIG. 1 illustrates a process in accordance with aspects of the present invention. The process is for the design of an electronic logic circuit, or system. In general, the process entails behavioral design of the system, mapping of components to match desired behavior, floor planning and modeling of the system using models of the mapped components, and physical implementation of the system. The components are based on groups and amalgamations of groups, or functions, which reside in files. In some embodiments the files, or information corresponding to information in the files, are maintained in libraries. The groups are of a nature to provide enhanced behavior with respect to area, speed and power, as well as allow for increased design productivity.

Groups are predesigned logic comprised of generally up to 5,000 gates, and usually from 300 to 3,000 gates. Each group is predefined in terms of behavior, functionality, timing, power and physical layout. Different sets of groups implement different functionality, and within sets of groups different groups may implement different behavior or implement the same behavior but have different characteristics. Groups are more fully discussed below.

The process includes a system design and analysis phase 101, a rapid virtual prototyping phase 103, and a physical design phase 105. In the system design and analysis phase a functional description of the system is developed and groups and amalgamations of groups are mapped to the functional description. Functional models of the groups are used to verify the functionality of the design. The functional models are, in one embodiment, maintained in a file 113.

When testing of the functional models indicate a successful mapping of groups to the functional description, the design is next checked to see if the functionality meets the written requirements document. If not the functional description is changed to reflect the desired functionality and the process is repeated. In the system design and analysis phase, therefore, the functionality or algorithmic behavior of the circuit is verified.

Upon satisfactory completion of the system design and analysis phase 101, the process proceeds to the rapid virtual prototyping phase 103. In the rapid virtual prototyping phase timing, area, and power usage are determined. Accordingly, top-level routing, detailed floor planning and group placement, and behavioral modeling is performed in the rapid virtual prototype phase. In one embodiment top-level routing is accomplished using airline top-level routing. Floor planning and group placement is performed using detailed physical models of the groups. Area estimates are made using the detailed physical information, with, in one embodiment, the estimation accomplished using software estimators which take into account the process technology used. The regular structure of groups, discussed below, allows for increased ease in performing floor planning tasks. The use of the behavioral and detailed physical models allows for timing, area and power estimation. In the event timing, area, and power parameters are not met, the process returns to system design and analysis.

In one embodiment of the rapid virtual prototyping phase of the process of FIG. 1 groups and functions are placed on a layout by a designer or an automated tool. Each of the groups and functions have a predefined layout space. Each of the groups and functions also have predefined interface points for the routing of signals to and from the groups and functions.

Figure 2:
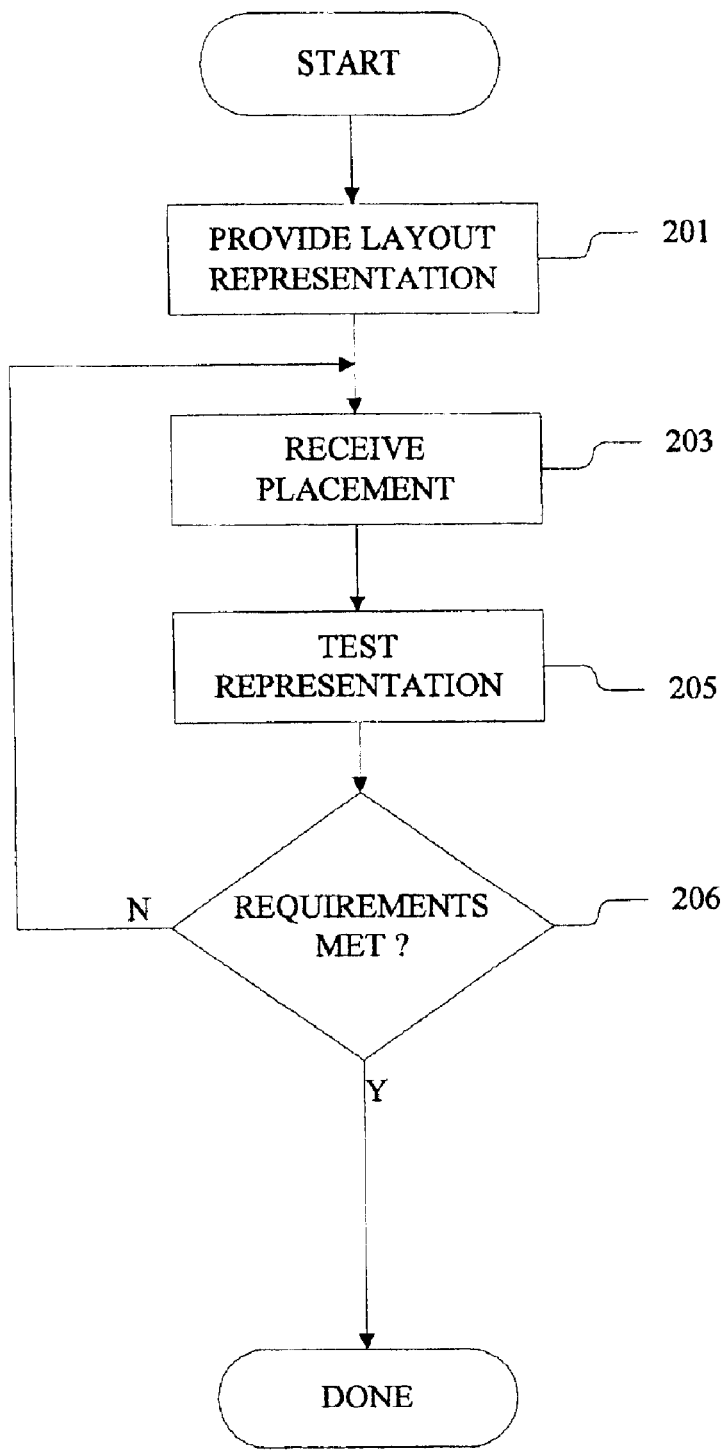
FIG. 2 is a flow chart of a process of laying out groups in accordance with the process of FIG. 1.

The layout process is performed, in one embodiment, in accordance with the process of FIG. 2. In Block 203 the process receives from the designer placement information of functions and groups on the floor plan layout. The placement of functions and groups on the floor plan layout forms a representation of the system. In Block 205 the process tests the representation of the system to determine if system timing and power requirements are met. If system timing and power requirements are not met the process returns to Block 203, and the designer adjusts the placement of functions and groups on the floor plan layout. If system timing and power requirements are met the process is complete. In some embodiments additional testing, and potentially re-placement of functions and groups, is also performed in the physical design stage.

In one embodiment the placement of functions and groups includes the selection of groups from a plurality of groups having the same capabilities but of different topographies. For example, layout considerations may cause a designer to desire use of a group having a first shape in one instance, but having a second shape in another instance. In both cases the capability of the group may be the same, but layout constraints may drive the designer to utilize different group topographies to accomplish the same, for example, logic constraint. Similarly, layout considerations may cause a designer to use functions having the same capabilities, but of different topographies. Thus, the process in the one embodiment provides the designer functions and groups with a range of topographies.

Within the layout portions, potential cross-talk is generally minimal. In large part this is due to the relatively small size of groups, reducing the need for wire lengths of any great length. In part, the potential cross-talk in the groups and functions may be minimized due to the skill of the designers.

Returning now to the process of FIG. 1, upon successful completion of the rapid virtual prototyping phase the process enters the physical design stage. In the physical design stage implementation files, generally GDSII files, are imported into a design. In addition some clock buffering and top level routing optimization is performed. Due to the predefined layout characteristics of the detailed models, however, the resulting physical design is largely free from errors. In other words, due to the predefined layout and behavioral definition of groups, the resulting physical design is largely correct by construction.

With respect to groups, groups are generally designed prior to development of the behavioral specification. The groups are designed so as to provide "black box" models and physical definitions available in the design process, with the models and definitions generally being placed in files. The groups are designed to implement behavior generally required by electronic logic systems, and to do so with care towards maximum performance, and minimizing area and power usage, as well as with care towards minimizing signal integrity issues for signals within a group.

Thus, in one embodiment, groups may be partitioned into data path groups, control groups, I/O groups, memory groups, and analog groups. Data path groups have arithmetic, logical and algorithmic capabilities, and may be, for example, add/subtract circuits, multiply circuits, square root circuits, multiply accumulate circuits, shift and add circuits, and other similar circuits. Control groups include state machines and combinatorial logic circuits. Memory groups include registers, queues and caches, and other similar circuits. I/O groups include bus structures, USBs, UARTs, SRAM, and similar circuits. Analog groups include circuits for such items as PLLs, A/D circuits, D/A circuits, drivers, clocks, and other similar circuits. Further examples of some of the types of processing provided by groups are provided in Table I.

TABLE I

| 4–8 bit Adders | Incrementer/decrementer | Various |
| --- | --- | --- |
| 4-bit twos-complement adder | 4-bit incrementer decrementer | Booth Recoder |
| 5-bit twos-complement adder | 5-bit incrementer decrementer | Carry save adder |
| 6-bit twos-complement adder | 6-bit incrementer decrementer | 16:1 shifter |
| 7-bit twos-complement adder | 7-bit incrementer decrementer | 32 shifter |

TABLE I-continued

| 4–8 bit Adders | Incrementer/decrementer | Various |
|---|---|---|
| 8-bit twos-complement adder | 8-bit incrementer decrementer | 64 bit adder |
| 4-bit absolute value adder | 4-bit incrementer decrementer w/zero | Signed magnitude adder |
| 5-bit absolute value adder | 5-bit incrementer decrementer w/zero | ROM |
| 6-bit absolute value adder | 6-bit incrementer decrementer w/zero | 4-bit register control |
| 7-bit absolute value adder | 7-bit incrementer decrementer w/zero | Iterative carry save adder |
| 8-bit absolute value adder | 8-bit incrementer decrementer w/zero | |

Figure 3:
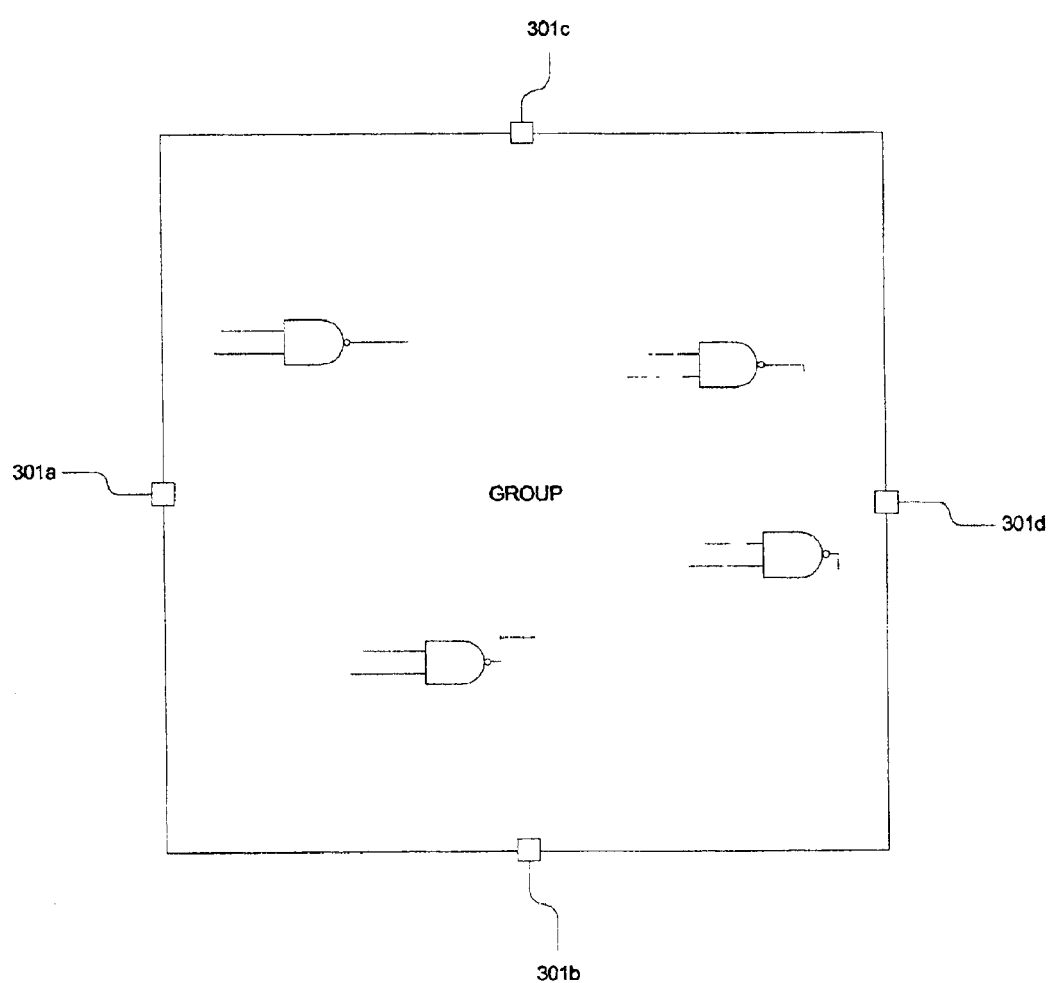
FIG. 3 is a diagram of a circuit group in accordance with aspects of the present invention.

With respect to area, FIG. 3 illustrates a layout space of a predefined first group. As illustrated, the group is arranged such that the boundaries of the group are of substantially equal linear length, and, in the case of the group of FIG. 3, in a square. The first group includes a plurality of targets, or interface points, 301a–d for receiving and propagating signals. Each of the interface points is located at predefined points along the boundaries of the group. In the embodiment of FIG. 3 a first interface point 301a is for receiving a first information signal, a second interface point 301b is for propagating a second information signal, and a third interface point 301c is used to connect the group to a clock signal and a fourth interface point 301d are used for coupling the group to power related sources. In the embodiment of FIG. 3 the first and second information signals are data signals. In another embodiment, however, the first information signal is a control signal and the second information signal is a data signal. In yet a further embodiment the first information signal is a data signal and the second information signal is a control signal. It will be recognized, however, that the number, placement, direction, and other details of interface points are generally determined during the design of a group, and may vary from group to group.

Figure 4:
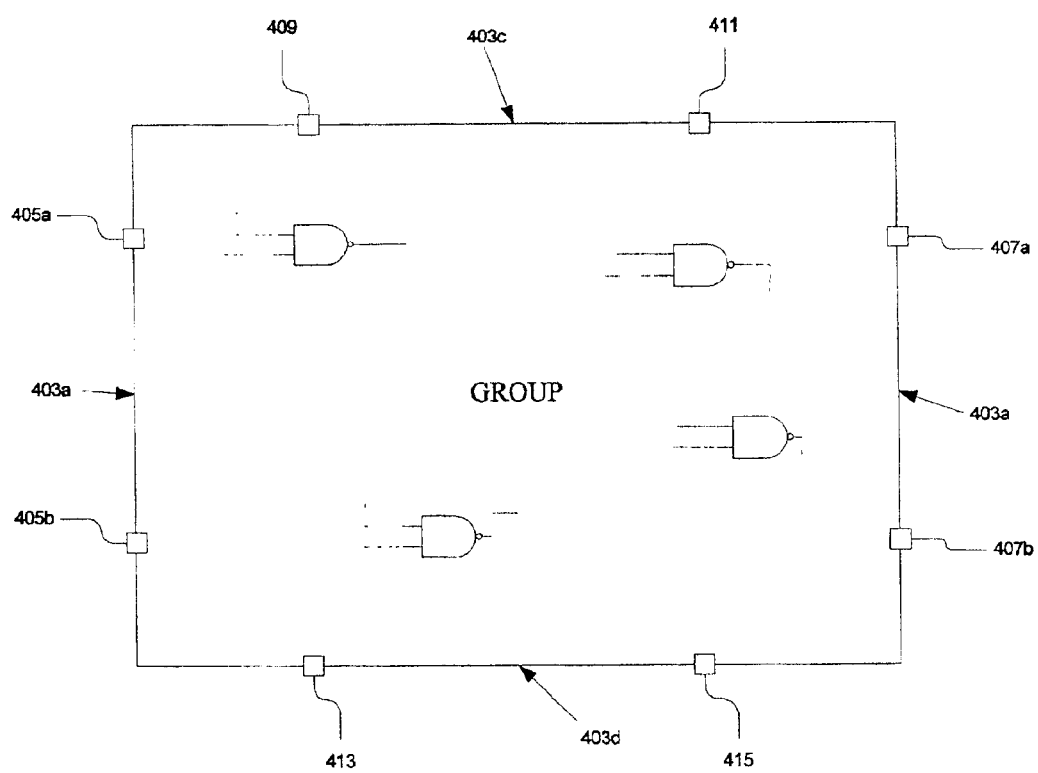
FIG. 4 is diagram of an alternative circuit group according to aspects of the present invention.

FIG. 4 illustrates a layout space of a second predefined group. As illustrated, the second predefined group is a rectangular group. The rectangular group includes a plurality of interface points 401a–h along each of the sides of the rectangular group. A first side 403a of the rectangular group includes information input interface points 405a–b. A second side 403b includes information output interface points 407a–b. A third side 403c includes clock interface point 409 and a power interface point 411. A fourth side 403d includes an information interface point 413 and a power interface point 415.

Figure 5:
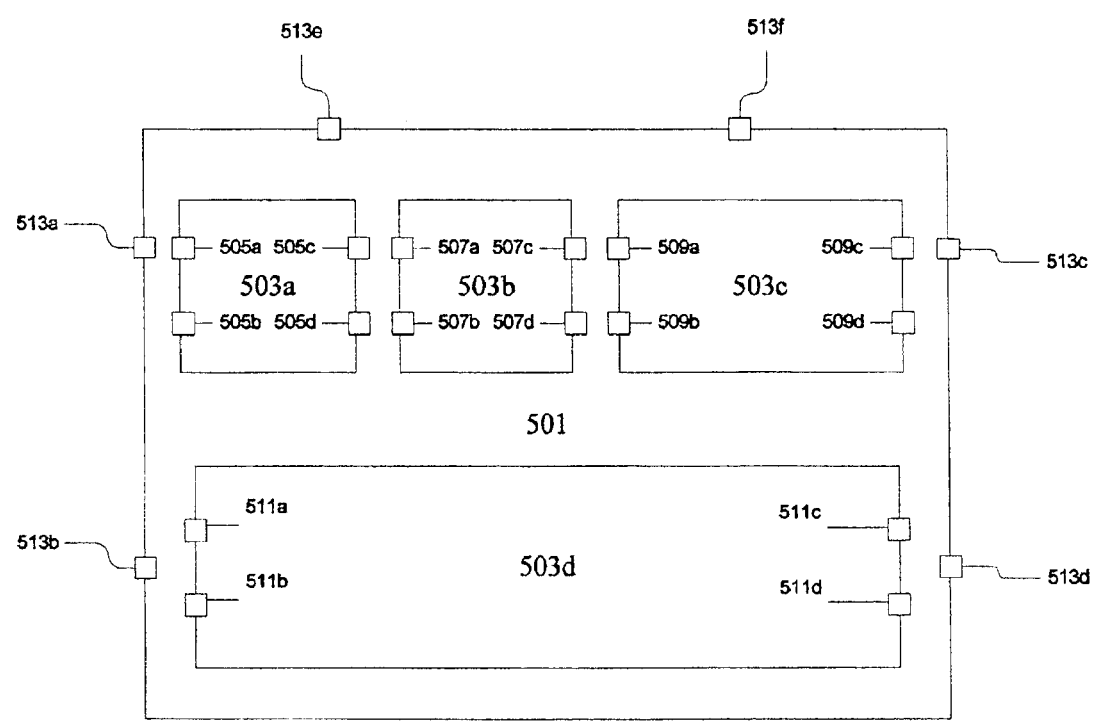
FIG. 5 is a diagram of a function according to aspects of the present invention.

FIG. 5 illustrates a function 501 comprised of groups. A function is an amalgamation of groups. The function includes a plurality of groups 503a–d. A first group 503a and a second group 503b are of a similar size and shape, and have similarly placed interface points 505a–d and 507a–d, respectively. As illustrated, the first group and the second group are arranged in a square. A third group 503c is of a different shape, rectangular as illustrated in FIG. 5. The third group has interface points 509a–h. A fourth group 503d is also rectangular in shape, as illustrated, but of different dimensions than the third group. The fourth group has interface points 511a–d.

The function has interface points 513a–f. The interface points in the embodiment illustrated in FIG. 5 are defined with respect to the size and shape of the function. In alternative embodiments, however, the interface points for the function are defined by the interface points of the groups making up the function, particularly the interface points which have signals propagating outside the function.

Figure 6:
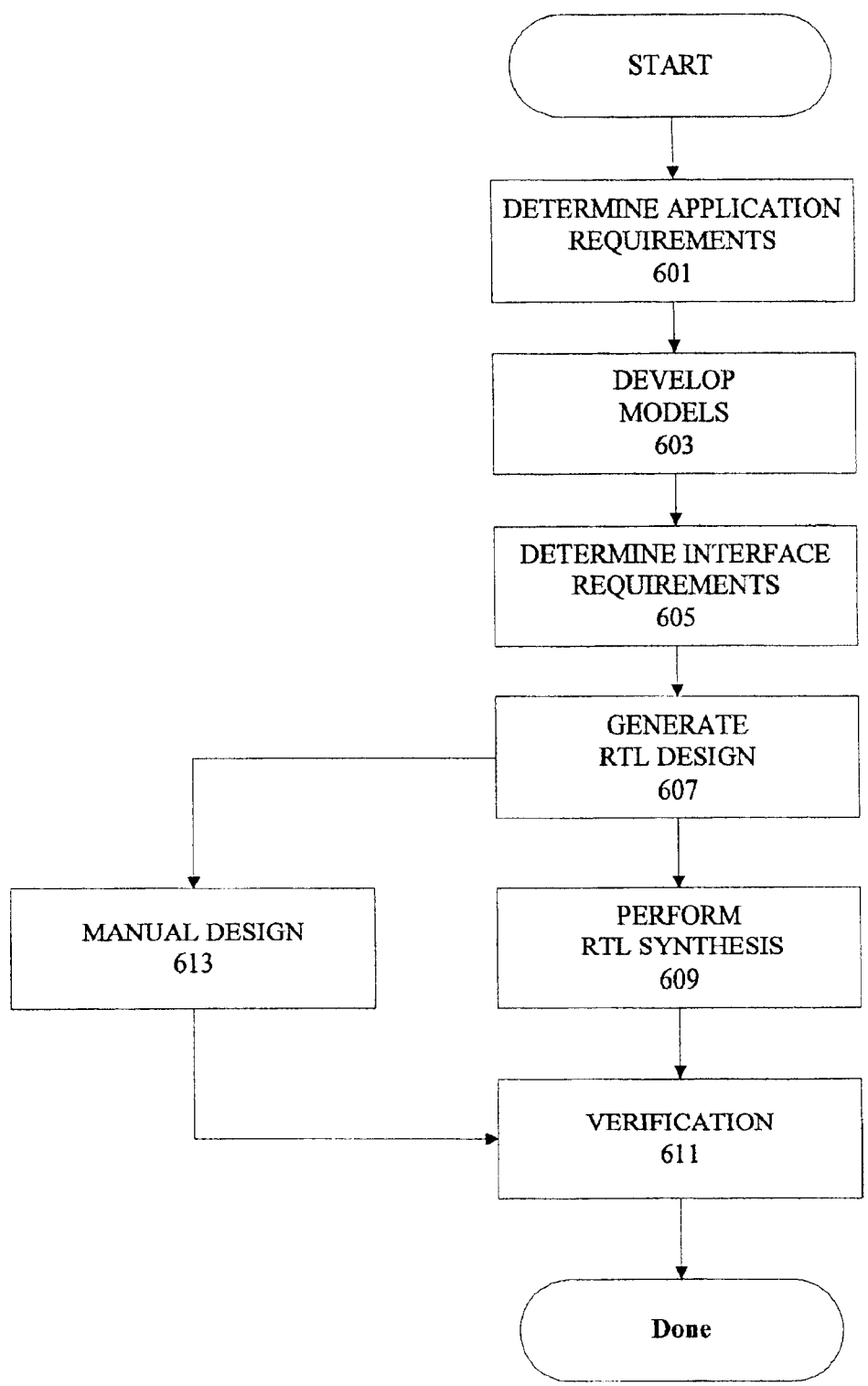
FIG. 6 is a flow chart of a method for designing groups according to aspects of the present invention.

FIG. 6 illustrates a flow diagram of an overview process of developing, or generating, groups in accordance with the present invention. In block 601 requirements for each group are determined based on general or high level conditions. In particular, requirements are determined based on their potential application, for example, their interaction or interface with predefined groups, their space occupancy, performance and/or power requirements. In block 603, models are developed to describe the functional and/or behavioral aspects of a group for which the application requirements are determined in block 101. In one embodiment, a hardware description language, such as Verilog or VHDL, or a high level software language, such as C or C++, are used to define or develop the functional and/or behavioral model. Additionally, these models are technologically independent, i.e., not dependent on a specific process technology or a specific design criteria used by any particular manufacturer. In addition, the models, if behavioral models, are not restrained to any particular timing or clock signal, and if they are functional models they usually do not have any timing. Once the models for the groups are determined, the process continues to block 105.

In block 605 the interface requirements for each group are determined. The interface requirements, in one embodiment, include timing, loading and/or placement or location requirements for both control inputs and outputs and data path inputs and outputs. The interface requirements also include buffering requirements. Buffering requirements establish conditions for storage buffers or drivers needed at the inputs and outputs of the groups. For instance, a depth of the storage buffers coupled at the inputs and/or outputs is established to prevent overruns or underflows, enhance pipelining and scan testing. External requirements are also included in the interface requirements. The external requirements concern power provided or consumed by a group, clock or timing information in and out of the group and shielding or interference needs to insulate a group from unwanted signals or noise from another group.

In block 607, a register transfer level (RTL) design is generated for the groups. A switch level design is developed using basic switch level primitives and is technology independent. Technology and cell libraries are also determined, along with timing constraints.

In block 609, RTL synthesis of the groups is performed in which the RTL design generated in block 607 is transformed from one level abstraction to a lower, more detailed level of abstraction. As such, timing constraints for the groups are further refined. Also, aspect ratio and area of a group is determined. Placement and routing information of the groups is also determined along with the location of input and output pins. Parasitics are also determined.

Alternatively, groups are designed manually. In many circumstances a manual design approach is preferred as manual design of the groups allows for increased attention to area, power, timing, and signal integrity issues. Thus, instead of performing synthesis in block 609, the process proceeds to block 613. In block 613 the design for each group is determined manually.

In block 611, testing and verification is performed on the groups, specifically, the functional, and behavioral models of the groups, RTL gate level design. Additionally, test vectors are generated, models are executed or physical layout tests are performed. The process then ends.

Figure 7:
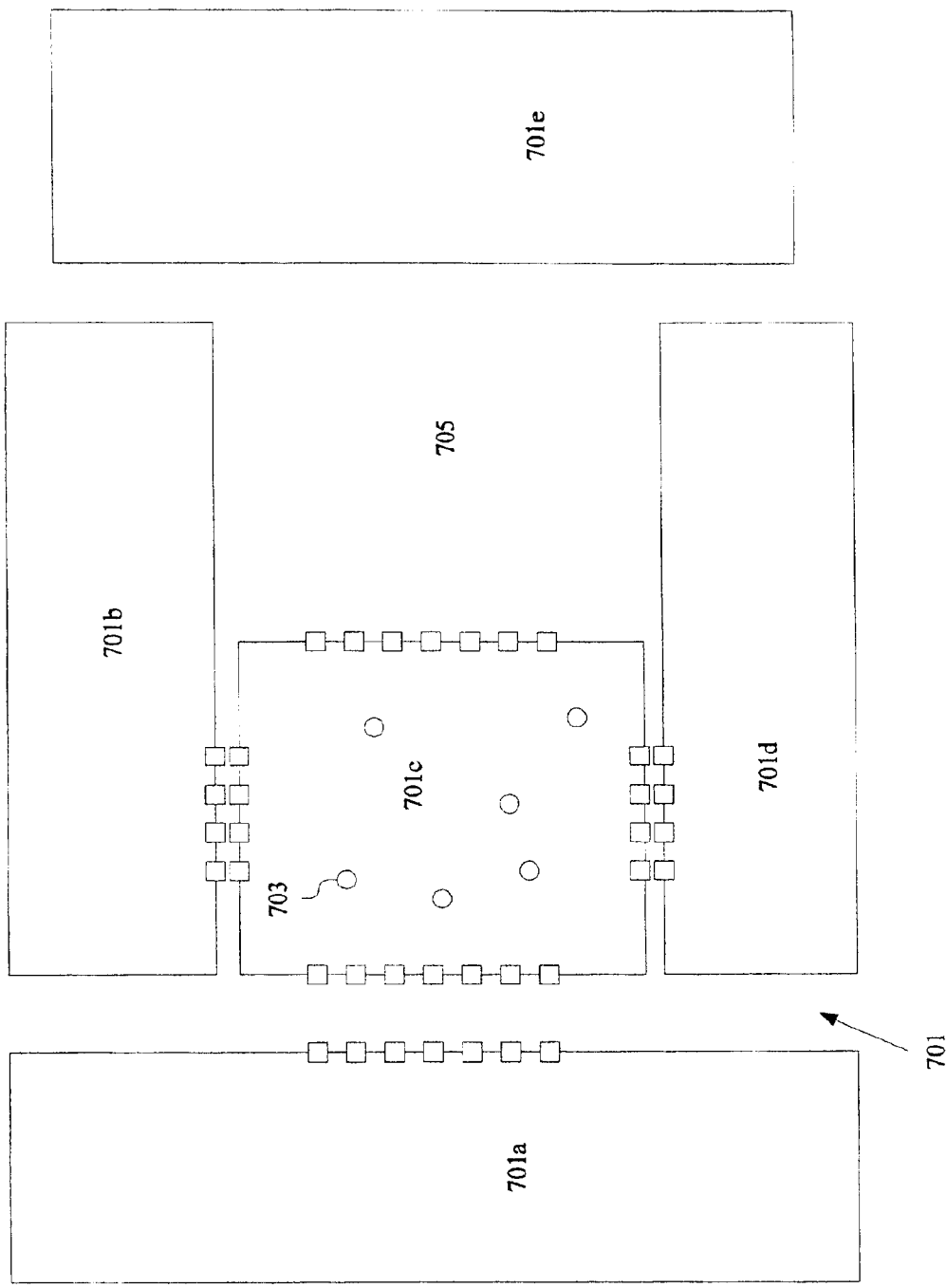
FIG. 7 is a block diagram of a portion of a circuit in accordance with the present invention.

FIG. 7 is a block diagram of an integrated circuit design comprised of groups. For purposes of discussion with respect to FIG. 7 some details of the integrated circuit design have been simplified. The integrated circuit design includes a plurality of design elements 701a–e. The design elements 701a, 701b, 701c, and 701e are groups. The design element 701d is a function. The groups and function have predefined layout areas, and predefined targets, or interface points.

The predefined interface points are adapted to provide for short signal paths between groups, particularly for groups laid out adjacent to one another. Thus, as may be seen with respect to groups comprising design elements 701b and 701c, interface points for the groups are arranged to easily connect signals between adjacent groups by abutment without the need for external wiring. In addition, within each of the groups gates forming each group are laid out to provide for short signal paths within the groups. Thus, the use of the functions and the groups serves to reduce the potential for signal cross-talk.

At times nearby groups, or even possibly some adjacent groups, may require some out of group wiring of signals. Moreover, at times groups and functions will be of such a size and shape that abutment of the groups and functions cannot be accomplished. Thus, the integrated circuit design of FIG. 7 includes a channel 701 and unused "white" space 705. The channel and white space allow for the routing of some signals, as well as providing for incongruities between abutting groups and functions.

Preferably, global signal routing is performed using separate metalization layers. For example, with six levels of metal, groups and functions use the first three levels for local interconnections. Global routing is done with the fourth and fifth levels, and clock and power signals are placed on the sixth level. The use of levels in such a manner allows for a minimum size chip. If fewer layers are used then there will be more channels between groups and functions increasing the die area. Smaller die area also translates to a faster design as well as fewer cross-talk opportunities in the global wires.

The use of separate metal layers also allows for the placement of group interface points, or targets, within the boundary of a group. Thus, as illustrated in FIG. 7, the group 701c includes interface points 703 within the boundary of the group.

At times, the interface points of a group are inconveniently located. At other times it may be desirable to provide groups with differing interface capabilities with respect to signal reception, signal driving, or output buffering for the purposes of pipelining or scan chain testing. Accordingly, in one embodiment trailers are provide for attachment to groups.

Figure 8:
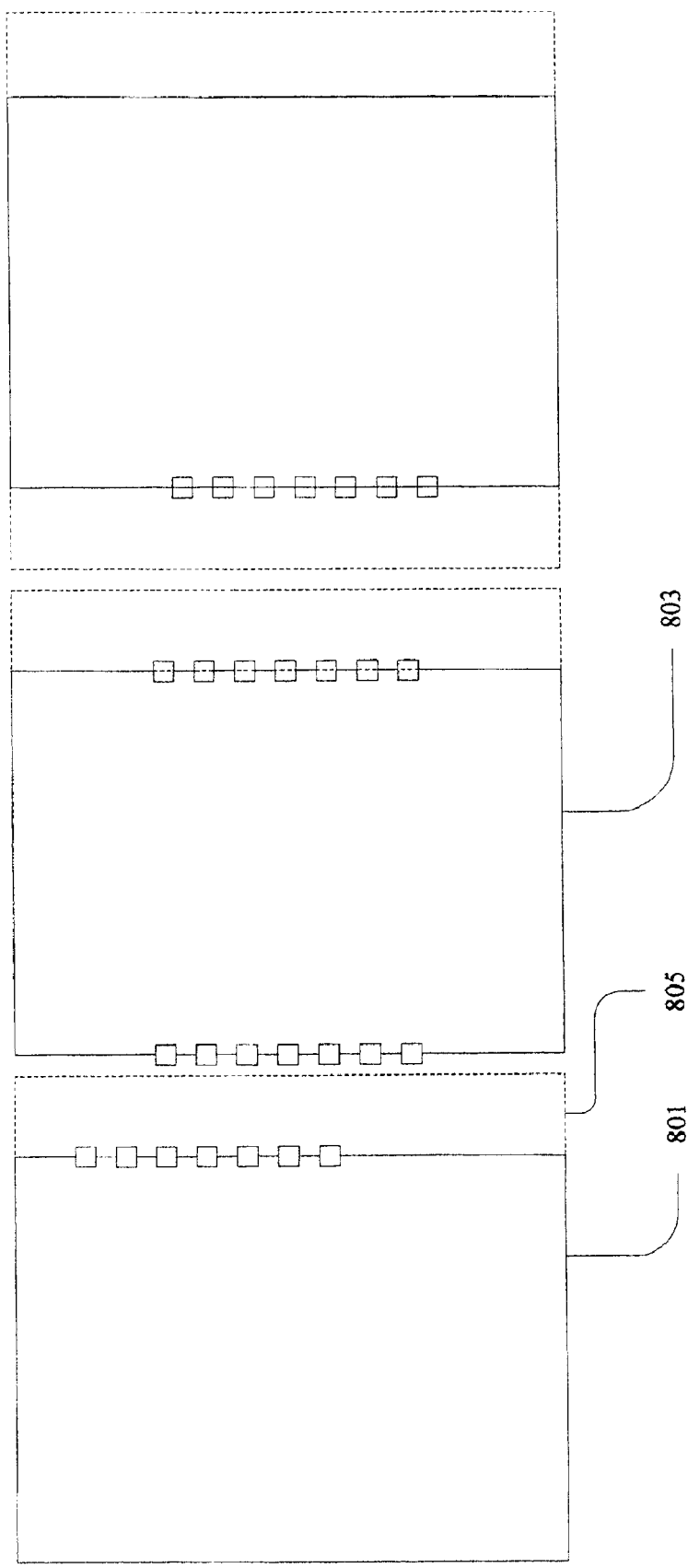
FIG. 8 is a block diagram illustrating the use of trailers with groups.

FIG. 8 illustrates a partial design with trailers attached to groups. A first group 801 interfaces with a second group 803. Unfortunately, the interface points for the first group and the second group do not abut, i.e. line up. Accordingly, a trailer 805 is attached to a side of the first group adjacent the second group. The trailer provides for linear physical translation of the interface signals associated with the interface points of the first group. In one embodiment, the trailer also provides flip-flops for buffering or staging of the outputs of the first group. In the event of scan chain testing, the flip-flops also provide for convenient control and observation points.

In some applications some groups may also require specialized signal processing. For example, in the partial design of FIG. 8 the second group requires specialized output signal processing, for example signals with signal drivers of an increased strength. Similarly, a third group receiving these signals may require processing of some nature of the signals received from the second group, or may require increased signal strength for signals propagating to the second group. Accordingly, trailers are attached to both the second group and the third group to provide these capabilities.

Figure 9:
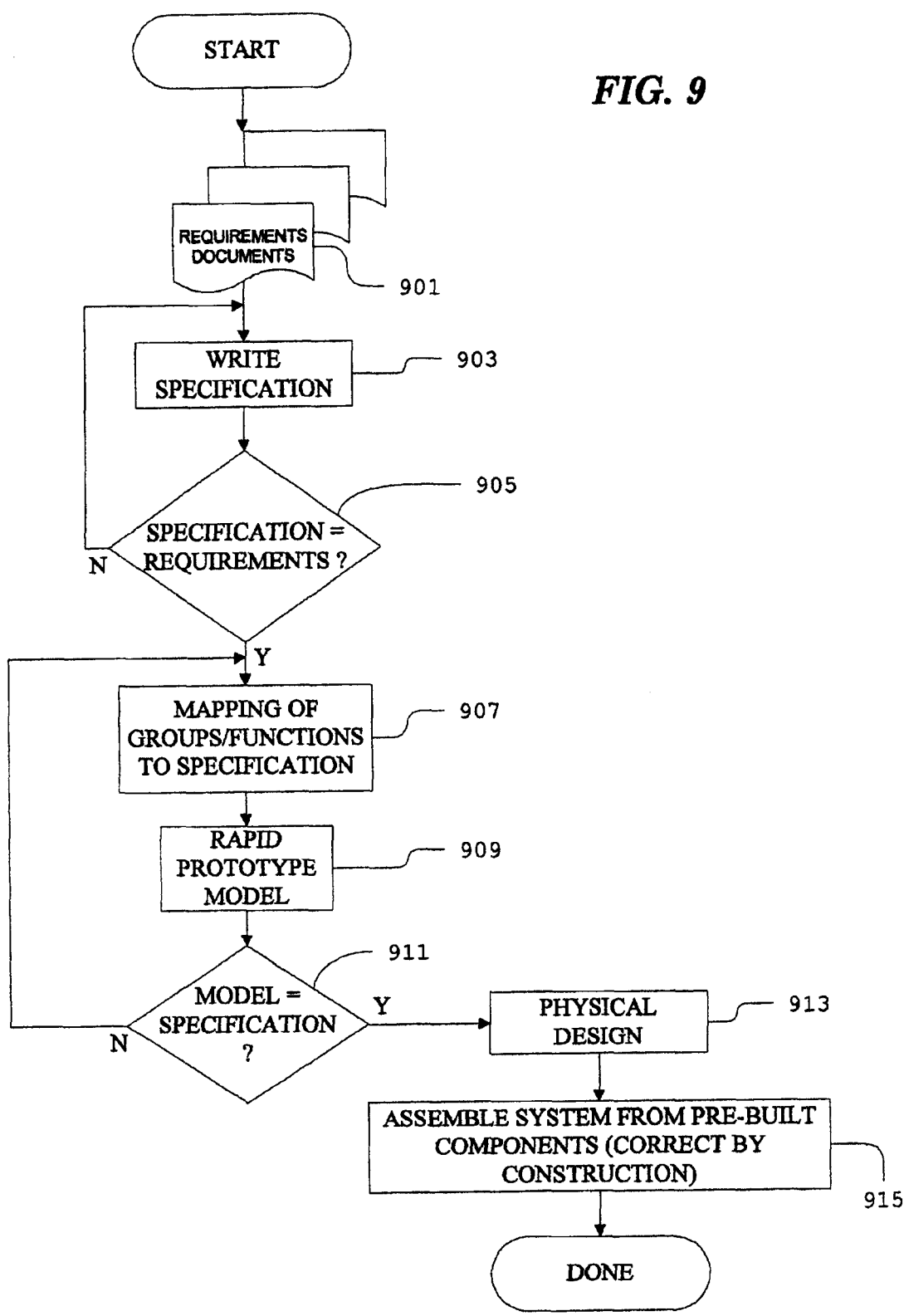
FIG. 9 is a further design flow for designing a portion of an integrated circuit using functions/groups in accordance with aspects of the present invention.

FIG. 9 is a flow chart of a further process of designing an integrated circuit in accordance with aspects of the present invention. In Block 901 requirements of the integrated circuit are determined. In Block 903 an HDL is generated for the integrated circuit. In Block 905 the HDL is checked against the requirements. If the HDL does not match the requirements the process returns to Block 903. If the specification matches the requirements the process continues to Block 907.

In Block 907 a mapping is done between the groups and functions and the HDL specification. The groups and functions represent previously developed circuits with predefined capabilities. The predefined capabilities are in terms of control capabilities, logic capabilities, analog, storage capabilities, or data processing capabilities. In general, functions are amalgamations of groups. A functional model is developed which describes the functionality or behavior of the design. There is no timing needed in this stage.

In Block 909 a behavioral model is formed based on the groups and functions mapped from the HDL. Timing is included in this model. In Block 911 the model is tested against the HDL. If the model does not match the specification the process returns to Block 907 and the mapping of functions and groups to the specification is adjusted.

If the model matches the specification in Block 911 the process proceeds to Block 913. In Block 913 the physical design of a system is completed. The present invention therefore provides for a group based design system, methodology, and electronic logic circuitry comprised of groups. Although the invention has been described with respect to certain specific embodiments, it should be recognized that the invention may be practiced otherwise than as specifically described. Accordingly, the present invention should not be restricted to the described embodiments, but instead defined by the appended claims and their equivalents, as well as the claims and equivalents supported by this document.

The preceding has been a description of the preferred embodiment of the invention. It will be appreciated that deviations and modifications can be made without departing from the scope of the invention, which is defined by the appended claims.

What is claimed is:

1. A method of designing an integrated circuit comprising:
    creating a netlist design for each of a set of sub-circuits, each sub-circuit performing an electronic operation and having at least 300 gates;
    creating a physical layout for each such sub-circuit which layout includes information defining the physical position of all components of the sub-circuit, and locations on each such sub-circuit for interconnecting such sub-circuit to at least one other circuit;
    defining desired electrical interconnections among all of the components of the sub-circuit, the electrical connections being defined on fewer than all layers available for the provision of interconnections in an integrated circuit to be designed later;
    defining interconnection information for providing electrical connections as needed among such components;
    optimizing the design and layout for each such sub-circuit to obtain a desired level of operating speed for such sub-circuit independently of any use of such sub-circuit with any other sub-circuit to thereby provide a completed design for the sub-circuit;

storing such completed design of the sub-circuit for later use in conjunction with other sub-circuits and other circuits;

creating a netlist design for the integrated circuit which includes at least two sub-circuits previously optimized and stored;

creating a physical layout for the integrated circuit by placing the at least two sub-circuits without changing the completed design of the sub-circuit on a design in proximity to each other; which layout includes information defining the physical position of the at least two sub-circuits and the locations on each such sub-circuit for interconnecting such sub-circuit to at least one other circuit; and defining desired electrical interconnections among the sub-circuits, the electrical connections being defined entirely on layers other than the layers used for the desired electrical interconnections among the components of the sub-circuits.

2. The method of claim 1 wherein in the step of defining desired electrical interconnections among all of the components of the sub-circuit, the electrical connections being defined on fewer than all layers available for the provision of interconnections in an integrated circuit to be designed later, at least one layer of the electrical interconnections does not include both power and clock signals.

3. The method of claim 1 wherein the plurality of layers are each layers having electrically conductive material thereon, with vias between at least two adjoining layers.

4. The method of claim 1 wherein as a result of the step of storing such completed design, each sub-circuit has a predefined size and shape, and that size and share are not changed by the step of creating a netlist design for the integrated circuit which includes at least two sub-circuits previously optimized and stored.

5. The method of claim 1 wherein each sub-circuits has predefined interconnection locations for connecting that sub-circuit to at least one other sub-circuit.

6. The method of claim 5 wherein each sub-circuit provides one of a plurality of logic functions.

7. The method of claim 6 wherein at least two sub-circuits having different size and shape provide the same logic function.

8. The method of claim 1 wherein each sub-circuit comprises a physical representation of a logic circuit.

9. The method claim 8 wherein each sub-circuit is defined by at least one GDSII file.

10. The method of claim 1 wherein each sub-circuit comprises 300 to 1000 gates.

11. The method of claim 1 wherein no layer in the layers available for the provision of interconnections in an integrated circuit to be designed later includes both electrical connections for interconnecting components of the sub-circuit and electrical connections for connecting one sub-circuit to another.

12. A method of designing an integrated circuit which includes at least two predefined sub-circuits, the method comprising:

creating a netlist design for each of the at least two sub-circuits, each sub-circuit performing an electronic operation and having at least 300 gates;

creating a physical layout for each such sub-circuit which layout includes information defining the physical position of all components of the sub-circuit, and locations on each such sub-circuit for interconnecting such sub-circuit to at least one other circuit;

defining desired electrical interconnections among the components of the sub-circuit, the electrical connections being defined on fewer than all layers available for the provision of interconnections in an integrated circuit to be designed later;

improving the design for each such sub-circuit to obtain a desired level of operating speed for such sub-circuit independently of any use of such sub-circuit with any other sub-circuit to thereby define for each such sub-circuit a configuration having a shape;

for each such sub-circuit, storing such improved design and shape for later use in conjunction with other sub-circuits;

creating a netlist design for the integrated circuit which integrated circuit includes the at least two sub-circuits previously stored;

creating a physical layout for the integrated circuit by placing the at least two sub-circuits in proximity to each other; which layout includes information defining the physical position of the at least two sub-circuits on the integrated circuit; and defining desired electrical interconnections among the sub-circuits, the electrical connections being defined entirely on layers other than the layers used for the desired electrical interconnections among the components of the sub-circuits.

13. The method of claim 12 wherein in the step of defining desired electrical interconnections among all of the components of the sub-circuit, the electrical connections being defined on fewer than all layers available for the provision of interconnections in an integrated circuit to be designed later, at least one layer of the electrical interconnections does nor include both power and clock signals.

14. The method of claim 12 wherein each sub-circuit provides one of a plurality of logic functions.

15. The method of claim 14 wherein at least two sub-circuits having different size and shape provide the same logic function.

16. The method of claim 12 wherein each sub-circuit comprises a physical representation of a logic circuit.

17. The method of claim 16 wherein each sub-circuit is defined by at least one GDSII file.

18. The method of claim 12 wherein each sub-circuit comprises 300 to 1000 gates.

19. The method of claim 12 wherein no layer in the layers available for the provision of interconnections in an integrated circuit to be designed later includes both electrical connections for interconnecting components of the sub-circuit and electrical connections for connecting one sub-circuit to another.

* * * * *